(12) United States Patent
Yoo et al.

(10) Patent No.: US 10,418,577 B2
(45) Date of Patent: Sep. 17, 2019

(54) WHITE ORGANIC LIGHT EMITTING DEVICE

(71) Applicant: LG DISPLAY CO., LTD., Seoul (KR)

(72) Inventors: Tae Sun Yoo, Goyang-si (KR); Hwa Kyung Kim, Seoul (KR); Hong Seok Choi, Seoul (KR); Jae Il Song, Paju-si (KR); Mi Young Han, Paju-si (KR); Shin Han Kim, Goyang-si (KR); Hye Min Oh, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/012,267

(22) Filed: Jun. 19, 2018

(65) Prior Publication Data

US 2018/0301652 A1    Oct. 18, 2018

Related U.S. Application Data

(60) Continuation of application No. 14/949,184, filed on Nov. 23, 2015, now Pat. No. 10,026,915, which is a
(Continued)

(30) Foreign Application Priority Data

Dec. 18, 2012 (KR) ........................ 10-2012-0148300
Sep. 26, 2013 (KR) ........................ 10-2013-0114553

(51) Int. Cl.
H01L 51/50    (2006.01)
H01L 51/52    (2006.01)
H01L 27/32    (2006.01)

(52) U.S. Cl.
CPC ...... *H01L 51/5028* (2013.01); *H01L 27/3209* (2013.01); *H01L 51/504* (2013.01);
(Continued)

(58) Field of Classification Search
CPC ............... H01L 51/5028; H01L 51/504; H01L 51/5044; H01L 51/5056; H01L 27/3209; H01L 2251/558; H01L 51/5092
(Continued)

(56) References Cited

U.S. PATENT DOCUMENTS

2005/0136289 A1    6/2005   Chu et al.
2006/0040132 A1    2/2006   Liao et al.
2006/0049419 A1    3/2006   Tanaka et al.
2006/0186793 A1    8/2006   Iou
2006/0261731 A1    11/2006  Aziz et al.
2008/0160345 A1    7/2008   Inoue et al.
(Continued)

FOREIGN PATENT DOCUMENTS

CN    1866536 A      11/2006
CN    101217187 A    7/2008
(Continued)

*Primary Examiner* — Thinh T Nguyen
(74) *Attorney, Agent, or Firm* — Birch, Stewart, Kolasch & Birch, LLP

(57) ABSTRACT

An organic light emitting device can include first and second electrodes formed to face each other on a substrate; a first stack interposed between the first and second electrode and configured with a hole injection layer, a first hole transportation layer, a first light emission layer and a first electron transportation layer which are stacked on the first electrode; a second stack interposed between the first stack and the second electrode and configured with a second hole transportation layer, a second light emission layer, a third light emission layer and a second electron transportation layer which are stacked on the first stack; a third stack interposed between the second stack and the second electrode and configured with a third hole transportation layer, a fourth light emission layer, a third electron transportation layer and an electron injection layer which are stacked on the second stack; and a first charge generation layer interposed between the first and second stacks and a second charge generation layer interposed between the second and third stacks.

22 Claims, 5 Drawing Sheets

Related U.S. Application Data division of application No. 14/109,634, filed on Dec. 17, 2013, now Pat. No. 9,224,967.

(52) U.S. Cl.
CPC ...... *H01L 51/5044* (2013.01); *H01L 51/5056* (2013.01); *H01L 51/5072* (2013.01); *H01L 51/5088* (2013.01); *H01L 51/5092* (2013.01); *H01L 51/5206* (2013.01); *H01L 51/5221* (2013.01); *H01L 51/5016* (2013.01); *H01L 2251/5361* (2013.01); *H01L 2251/5376* (2013.01); *H01L 2251/5384* (2013.01); *H01L 2251/558* (2013.01)

(58) Field of Classification Search
USPC ............ 257/40, 72, 79; 438/48, 82, 99, 128
See application file for complete search history.

(56) References Cited

U.S. PATENT DOCUMENTS

| | | |
|---|---|---|
| 2008/0297036 A1 | 12/2008 | Noh et al. |
| 2011/0095276 A1 | 4/2011 | Imai et al. |
| 2012/0205701 A1 | 8/2012 | Sasaki et al. |
| 2013/0092909 A1* | 4/2013 | Han et al. ............ H01L 51/504 257/40 |
| 2013/0292664 A1 | 11/2013 | Nishimura et al. |

FOREIGN PATENT DOCUMENTS

| | | |
|---|---|---|
| CN | 100544057 C | 9/2009 |
| EP | 1705728 A2 | 9/2006 |
| KR | 10-2010-0073417 A | 7/2010 |

\* cited by examiner

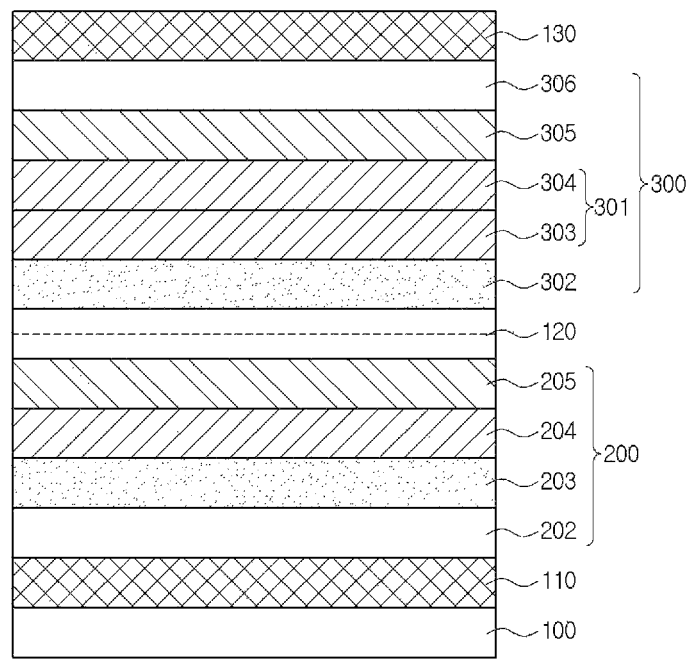

FIG. 9

|  | Brightness Achievement Ratio | | | Panel efficiency | Color reproduction range |
| --- | --- | --- | --- | --- | --- |
|  | R | G | B | | |
| Related Art | 88% | 139% | 112% | 100% | 100% |
| Present Disclosure | 101% | 119% | 112% | 101% | 103% |

WHITE ORGANIC LIGHT EMITTING DEVICE

CROSS-REFERENCE TO RELATED APPLICATIONS

This application is a Continuation of co-pending U.S. patent application Ser. No. 14/949,184 filed on Nov. 23, 2015, which is a Divisional of U.S. patent application Ser. No. 14/109,634 filed on Dec. 17, 2013 (now U.S. Pat. No. 9,224,967 issued on Dec. 29, 2015), which claims the priority benefit under 35 U.S.C. § 119(a) of Korean Patent Application Nos. 10-2013-0114553 filed in the Republic of Korea on Sep. 26, 2013, and 10-2012-0148300 filed in the Republic of Korea on Dec. 18, 2012, all of which are hereby expressly incorporated by reference into the present application.

BACKGROUND OF THE INVENTION

Field of the Invention

The present application relates to an organic light emitting device, and more particularly to a white organic light emitting device adapted to enhance efficiency and color reproduction range and reduce power consumption.

Discussion of the Related Art

Nowadays, a display field for visually representing an electrical information signal has been rapidly developed with the spread of substantial information society. In accordance therewith, a variety of flat panel display devices with features, such as slimness, light weight and low power consumption have been developed. Also, the flat panel display devices have been rapidly replacing the existing cathode ray tubes (CRTs).

As examples of the flat panel display devices, liquid crystal display (LCD) devices, plasma display panel device (PDPs), field emission display (FED) devices, organic light emitting display (OLED) devices and so on can be introduced. Among the flat panel display devices, the OLED device is being considered as the most competitive application. This results from the fact that the OLED device without any separated light source can compact its applied appliance and display vivid colors.

It is necessary for the OLED device to form an organic light emission layer. The organic light emission layer is formed using a deposition method of the related art which employs a shadow mask.

However, a large-sized shadow mask can be sagged due to its load (or its weight). Due to this, a fault can be generated the formed organic light emission layer pattern. Also, the shadow mask cannot be used several times. In view of this point, it is necessary to provide alternative proposals.

As one of several methods for removing the shadow mask, a white OLED device has been proposed. The white OLED device will now be described.

The white OLED device enables a plurality of layers between an anode and a cathode to be deposited without any mask at the formation of a light emitting diode. In other words, an organic light emission layer and the other organic films, which include different materials, are sequentially deposited in a vacuum state. Such a white OLED device is used for various purposes, such as a thin light source, a backlight of the LCD device, a full-color display device with color filters or others.

The ordinary white OLED device uses a phosphorescent/fluorescent stack structure. The phosphorescent/fluorescent stack structure includes a first stack using a light emission layer of a blue fluorescent material and a second stack which is formed on the first stack and uses another light emission layer of a yellow-green phosphorescent material. Such a white OLED device can realize white light by mixing blue light emitted from the blue fluorescent mater and yellow light (or yellow and green lights) emitted from the yellow-green phosphorescent material.

However, it is necessary (or difficult) for the white OLED device of the phosphorescent/fluorescent stack structure to enhance luminous efficiency and color reproduction range and reduce power consumption.

SUMMARY OF THE INVENTION

Accordingly, embodiments of the present application are directed to a white organic light emitting device that substantially obviates one or more of problems due to the limitations and disadvantages of the related art.

The embodiments are to provide a white organic light emitting device which includes first and second stacks or first through third stacks and enables a light emission layer to have a three-peaked luminous property.

Also, the embodiments are to provide a white organic light emitting device which is easy to inject holes by enabling a host of a light emission layer of a second stack adjacent to a hole transportation layer to be formed the same material as the hole transportation layer.

Moreover, the embodiments are to provide a white organic light emitting device that is adapted to enhance panel efficiency and color reproduction range and reduce power consumption by optimizing thickness and doping density of a light emission layer of a second stack.

Furthermore, the embodiments are to provide a white organic light emitting device with first through third stacks that is adapted to enhance a red brightness achievement ratio and color reproduction range by forming a light emission layer of the second stack in a double-layered structure.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to an general aspect of the present embodiment for solving problems of the related art, a white organic light emitting device includes: first and second electrodes formed to face each other on a substrate; a first stack configured with a hole injection layer, a first hole transportation layer, a first light emission layer and a first electron transportation layer which are sequentially stacked between the first and second electrodes; a second stack configured with a second hole transportation layer, a second light emission layer, a third light emission layer, a second electron transportation layer and an electron injection layer which are sequentially stacked between the first stack and the second electrode; and a charge generation layer interposed between the first and second stacks and configured to adjust a charge balance between the two stacks. The first light emission layer of the first stack is a blue fluorescent light emission layer with a single-peaked luminous property, and the second and third light emission layers of the second stack have a two-peaked luminous property and come in contact with each other. One of the second and third light emission layers is one of green and yellow-green phosphorescent light emission layer, and the other one of the second and third light emission layers is a red phosphorescent light emission layer.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings:

FIG. 1 is a cross-sectional view showing a white organic light emitting device according to a first embodiment of the present disclosure;

FIG. 2 is a table comparatively illustrating experimental resultants of white organic light emitting devices according to the present disclosure and the related art;

FIG. 9 is a table comparatively illustrating experimental resultants of white organic light emitting devices according to the present disclosure and the related art.

DETAILED DESCRIPTION OF THE EMBODIMENTS

Figure 3:
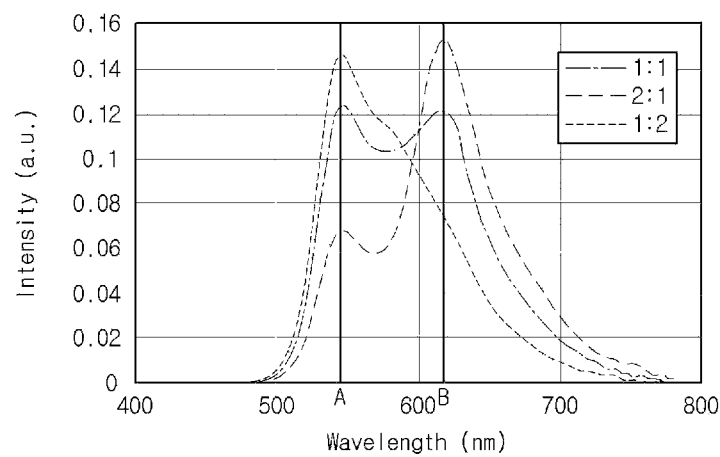
FIG. 3 is a data sheet illustrating luminous wavelength and intensity properties of white organic light emitting device according to the present disclosure and the related art.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. In the drawings, the size, thickness and so on of a device can be exaggerated for convenience of explanation. Wherever possible, the same reference numbers will be used throughout this disclosure including the drawings to refer to the same or like parts.

FIG. 1 is a cross-sectional view showing a white organic light emitting device according to a first embodiment of the present disclosure.

Referring to FIG. 1, the white organic light emitting device according to a first embodiment of the present disclosure includes first and second electrodes 110 and 130 formed on a substrate 100 in such manner as to face each other. A first stack 200, a charge generation layer 120 and a second stack 300 are interposed between the first and second electrodes 110 and 130. The first stack 200, the charge generation layer 120 and the second stack 300 can be formed by being sequentially stacked on the first electrode 110. The first and second stacks 200 and 300 include different color light emission layers from each other. Different color lights emitted from the light emission layers of the first and second stacks 200 and 300 are mixed, thereby realizing white light.

The substrate 100 can become an insulation substrate. A thin film transistor (not shown) can be formed on the insulation substrate. The insulation substrate can be formed from one of glass, a metal material, a plastic material, polyimide (PI) and so on. The thin film transistor can include a gate electrode, a semiconductor layer, a source electrode and a drain electrode.

The first electrode 110 can be used as an anode electrode. Also, the first electrode 110 can be formed from a transparent conductive material. For example, the first electrode 110 can be formed from one selected from a material group which includes ITO (indium-tin-oxide), IZO (indium-zinc-oxide) and ZnO.

The second electrode 130 can be used as a cathode electrode. Also, the second electrode 130 can be formed from a metal material with a low work function. For example, the second electrode 130 can be formed from one selected from a group which includes Mg, Ca, Al, Al-alloys, Ag, Ag-alloys, Au and Au-alloys.

The charge generation layer 120 interposed between the first and second stacks 200 and 300 can apply electrons to the first stack 200 and holes to the second stack 300. As such, the charge generation layer 120 can adjust (or control) charge balance between the first and second stacks 200 and 300. Such a charge generation layer 120 can be formed in a single layer. For example, the charge generation layer 120 can become a thin metal layer, which is formed from aluminum Al or others, or a transparent electrode formed from ITO (indium-tin-oxide) or others. The single layered charge generation layer can enable the device to be simply configured and easily manufactured.

Alternatively, the charge generation layer 120 can be formed in a multi-layered structure, such as a junction structure of an organic material layer which is formed by doping dopants. The charge generation layer 120 with the multi-layered structure can easily transport the electrons and the holes. As such, luminous efficiency of the device can be enhanced and the life span of the device can be extended. For example, a surface layer of the charge generation layer 120, which comes in contact with the first stack 200, can be doped with an N-type dopant, in order to smoothly transfer electrons. Also, the other surface layer of the charge generation layer 120, which comes in contact with the second stack 300, can be doped with a P-type dopant, in order to smoothly transfer holes.

The first stack 200 includes a hole injection layer (HIL) 202, a first hole transportation layer (HTL) 203, a first light emission layer 204 and a first electron transportation layer (ETL) 205 which are sequentially stacked between the first electrode 110 and the charge generation layer 120.

The hole injection layer (HIL) 202 can be formed from a material with superior hole injection capacity. In order to smoothly inject holes, the hole injection layer (HIL) 202 can be doped with a P-type dopant.

The first light emission layer 204 can become a blue fluorescent light emission layer. Also, the first light emission layer 204 can become a single light emission layer with a single luminous peak. Such a first light emission layer 204 can include a single host doped with a blue fluorescent dopant. Alternatively, the first light emission layer 204 can be configured with two hosts doped with a blue fluorescent dopant. As an example of the blue fluorescent dopant of the first light emission layer 204, a dopant with a wavelength band of the luminous peak (or, a luminous peak wavelength band) of about 420 nm-490 nm can be used.

The second stack 300 includes a second hole transportation layer (HTL) 302, a second light emission layer 303, a third light emission layer 304, a second electron transportation layer (ETL) 305 and an electron injection layer (TIL) 306 which are sequentially stacked between the charge generation layer 120 and the second electrode 130.

The electron injection layer (EIL) 306 can be formed from a material with superior electron injection capacity. In order to smoothly inject electrons, the electron injection layer (HIL) 306 can be doped with an N-type dopant.

The second stack 300 allows the second and third light emission layers 303 and 304 to be formed without having any one of a charge generation and a buffer layer therebetween. In other words, the second and third light emission layers 303 and 304 can come in contact with each other. The stacked second and third light emission layers 303 and 304 can form a single light emission layer stack 301.

The light emission layer stack 301 can be formed by stacking a red phosphorescent light emission layer and a green phosphorescent light emission layer. Also, the light emission layer stack 301 can be formed in a double-layered structure with two luminous peaks. Alternatively, the light emission layer stack 301 can be formed by stacking a red phosphorescent light emission layer and a yellow-green phosphorescent light emission layer.

If the second light emission layer 303 is the red phosphorescent light emission layer, the third light emission layer 304 can become one of the green phosphorescent light emission layer and the yellow-green phosphorescent light emission layer. On the contrary, when the second light emission layer 303 is one of the green phosphorescent light emission layer and the yellow-green phosphorescent light emission layer, the third light emission layer 304 can become the red phosphorescent light emission layer. Preferably, the second light emission layer 303 becomes the red phosphorescent light emission layer and the third light emission layer 304 becomes the green phosphorescent light emission layer.

The green phosphorescent light emission layer or the yellow-green phosphorescent light emission layer can be formed by doping a green phosphorescent dopant or a yellow-green phosphorescent dopant which has a luminous peak wavelength band of about 500 nm-580 nm. The red phosphorescent light emission layer can be formed by doping a red phosphorescent dopant with a luminous peak wavelength band of 580 nm-680 nm. A doping ratio of the green or yellow-green phosphorescent dopant of the green or yellow-green phosphorescent light emission layer can become higher than that of the red phosphorescent dopant of the red phosphorescent light emission layer.

The green or yellow-green phosphorescent light emission layer can be formed thicker compared to the red phosphorescent light emission layer. Preferably, the green or yellow-green phosphorescent light emission layer becomes three times thicker than the red phosphorescent light emission layer.

The second light emission layer 303 can be formed directly on the second hole transportation layer 302. In other words, the second light emission layer 303 can come in contact with the second hole transportation layer 302. Also, the second light emission layer 303 can include two hosts doped with one of red, green and yellow-green phosphorescent dopants. The two hosts can include a hole type host and an electron type host. The hole type host can be formed to have a range of about 20~80 volume % with respect to all the hosts. On the other hand, the electron type host can be formed to have a range of about 80~20 volume % with respect to all the hosts.

The hole type host can be formed from the same material as the second hole transportation layer 302. If the hole type host comes in direct contact with the second hole transportation layer 302 and is formed from the same material as the second hole transportation layer 302, holes can be easily injected into the second light emission layer 303.

The third light emission layer 304 formed on the second light emission layer 303 can include two hosts doped with one of green, yellow-green and red phosphorescent dopants. The two hosts can include a hole type host and an electron type host. The hole type host can be formed to have a range of about 20~80 volume % with respect to all the hosts. On the other hand, the electron type host can be formed to have a range of about 80~20 volume % with respect to all the hosts.

Also, one host of the third light emission layer 304 can be formed by doping one of green, yellow-green and red phosphorescent dopants. Also, the doped host can be formed to have a bipolar property.

In this manner, the first stack 200 adjacent to the anode electrode forms a fluorescent unit and the second stack 300 adjacent to the cathode electrode forms a phosphorescent unit. As such, luminous efficiency of the white organic light emitting device can be enhanced.

On the other hand, in order to reduce power consumption of the white organic light emitting device and enhance panel efficiency, it is necessary to optimize a volume ratio of the hosts within each of the second and third light emission layers, and thickness and doping density of each light emission layer.

FIG. 2 is a table comparatively illustrating experimental resultants of white organic light emitting devices according to the present disclosure and the related art. FIG. 3 is a data sheet illustrating luminous wavelength and intensity properties of white organic light emitting device according to the present disclosure and the related art.

FIGS. 2 and 3 comparatively illustrate a two-peaked panel (or luminous) efficiency and a color reproduction range of the white organic light emitting device according to the related art with a three-peaked panel (or luminous) efficiency and the color reproduction range of the white organic light emitting device according to the present disclosure. The white organic light emitting device of the related art used in the experiment includes a first stack with a blue light emission layer and a second stack with a yellow-green light emission layer. The white organic light emitting device of the present disclosure includes a first stack with a red light emission layer and a second stack with a green organic light emission layer. In FIGS. 2 and 3, a red luminous peak B (i.e., a third peak B) of three-peaked greenish has a stronger intensity than that of three-peaked reddish. On the other hand, a green luminous peak A (i.e., a second peak A) of three-peaked reddish has a stronger intensity compared to that of three-peaked greenish.

As seen from the experimental resultants I, II and IV, the white organic light emitting device of the present disclosure has a higher color reproduction range by about 10%, compared to that of the related art. Particularly, the three-peaked greenish represents that the white organic light emitting device of the present disclosure enhances the color reproduction range without reducing the panel (or luminous) efficiency. Also, in comparison with the experimental resultants I and V, it is evident that the white organic light emitting device of the present disclosure not only enhances the panel (or luminous) efficiency but also reduce power consumption, with having the same color reproduction range as that of the related art white organic light emitting device.

In other words, the white organic light emitting device of the present disclosure can either provide a higher color reproduction range or have higher panel (or luminous) efficiency and lower power consumption, compared to that of the related art. Moreover, the enhancement ratios of the color reproduction range and the panel (or luminous) efficiency and the reduction ratio of power consumption become larger, as the intensity of the green luminous peak A becomes stronger.

Although it is not shown in the drawings, the thicker the red light emission layer or the green light emission layer is formed, the higher the red and green luminous peaks A and B become. As seen from FIG. 2, it is evident that the panel (or luminous) efficiency and the color reproduction range are more enhanced as the green luminous peak A becomes stronger (or larger). As such, it is preferable for the green organic light emission layer to form thicker than the red organic light emission layer. More preferably, the green organic light emission layer is formed thrice as thick as the red organic light emission layer.

Figure 4:
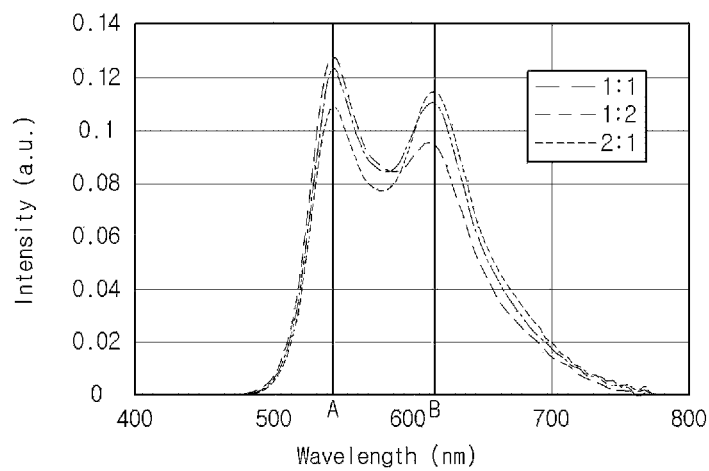
FIG. 4 is a data sheet illustrating experimental resultants in accordance with a volume ratio of hosts of a green light emission layer included in a second stack of the present disclosure.

FIG. 4 is a data sheet illustrating experimental resultants in accordance with a volume ratio of hosts of a green light emission layer included in a second stack of the present disclosure.

The experimental resultant of FIG. 4 relates to the green organic light emission layer of the second stack which includes the electron and hole type hosts doped with a green dopant. In detail, FIG. 4 illustrates green and red luminous peaks A and B of the second stack in accordance with the ratio of the electron and hole type hosts of the green organic light emission layer.

In the experiment, the condition of the red organic light emission layer is fixed. If the hole type host of the green organic light emission layer has a larger volume % compared to the electron type host, the green luminous peak A has the largest intensity but the red luminous peak B has the smallest intensity. On the contrary, when the volume % of the hole type host is small than that of the electron type host, the green luminous peak A has the smallest intensity but the red luminous peak B has the largest intensity. As shown in FIG. 2, the panel (or luminous) efficiency and the color reproduction range are more enhanced as the intensity of the green luminous peak A becomes larger. As such, in order to more enhance the panel efficiency and the color reproduction range compared to those of the related art, the intensity of the green luminous peak A must become larger (or stronger). To this end, the volume ration of the hole and electron type hosts can be properly set.

Figure 5:
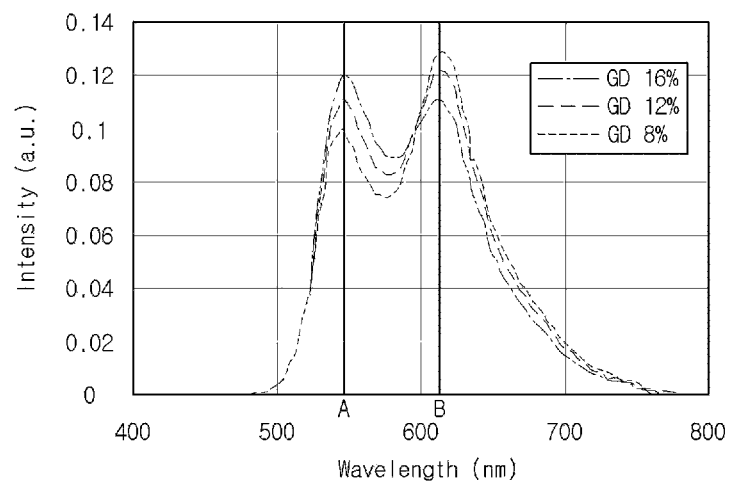
FIG. 5 is a data sheet illustrating experimental resultants in accordance with a volume ratio of hosts of a red light emission layer included in a second stack of the present disclosure.

FIG. 5 is a data sheet illustrating experimental resultants in accordance with a volume ratio of hosts of a red light emission layer included in a second stack of the present disclosure.

The experimental resultant of FIG. 5 relates to the red organic light emission layer of the second stack which includes the electron and hole type hosts doped with a red dopant. In detail, FIG. 5 illustrates green and red luminous peaks A and B of the second stack in accordance with the ratio of the electron and hole type hosts of the red organic light emission layer.

The condition of the green organic light emission layer is fixed for the experiment. If the hole type host of the red organic light emission layer has a larger volume % compared to the electron type host, the green luminous peak A has the largest intensity but the red luminous peak B has the smallest intensity. On the contrary, when the volume % of the hole type host is small than that of the electron type host, the green luminous peak A has the smallest intensity but the red luminous peak B has the largest intensity. As shown in FIG. 2, the panel (or luminous) efficiency and the color reproduction range are more enhanced as the intensity of the green luminous peak A becomes larger. As such, in order to more enhance the panel efficiency and the color reproduction range compared to those of the related art, the intensity of the green luminous peak A must become larger (or stronger). To this end, the volume ration of the hole and electron type hosts can be properly set.

Figure 6:
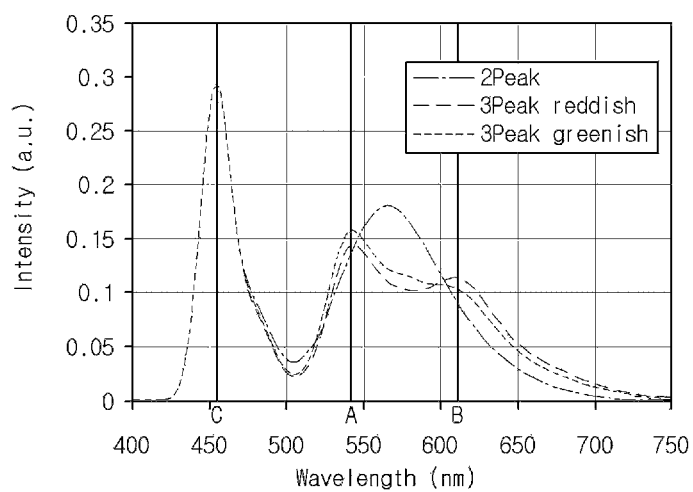
FIG. 6 is a data sheet illustrating experimental resultants in accordance with a doping ratio of a green light emission layer included in a second stack of the present disclosure.

FIG. 6 is a data sheet illustrating experimental resultants in accordance with a doping ratio of a green light emission layer included in a second stack of the present disclosure.

The experimental resultant of FIG. 6 relates to the green organic light emission layer of the second stack which includes hosts doped with a green dopant. In detail, FIG. 6 illustrates green and red luminous peaks A and B of the second stack in accordance with the doping ratio of the green dopant.

As shown in FIG. 9, the intensity of the green luminous peak A becomes larger as the doping ratio of the green dopant becomes higher. Similarly, although it is not shown in the drawing, the intensity of the red luminous peak B becomes larger as the doping ration of the red dopant for the red organic light emission layer of the second stack becomes higher. As shown in FIG. 2, the panel (or luminous) efficiency and the color reproduction range are more enhanced as the intensity of the green luminous peak A becomes larger. As such, it is preferable for the doping ratio of the green dopant of the green organic light emission layer to set higher than that of the red dopant of the red organic light emission layer.

Figure 7:
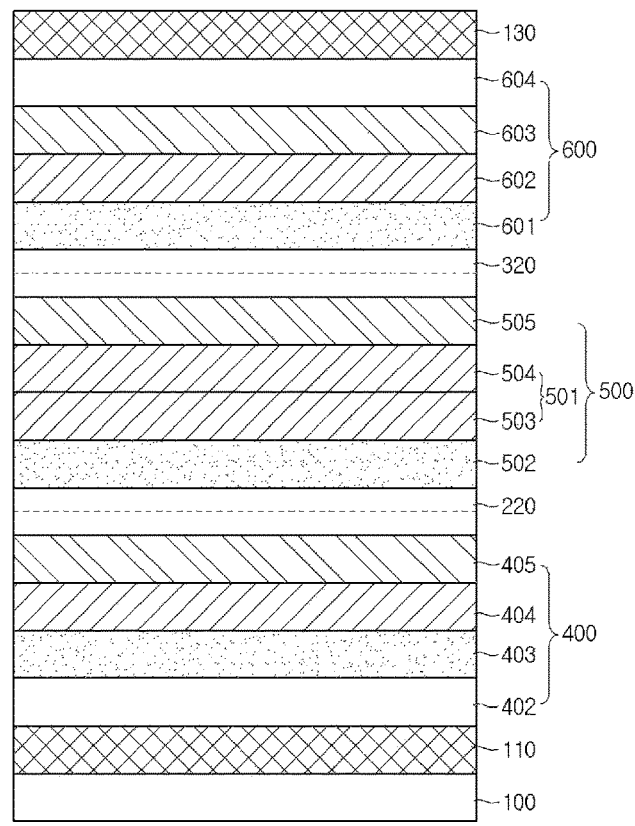
FIG. 7 is a cross-sectional view showing a white organic light emitting device according to a second embodiment of the present disclosure.

FIG. 7 is a cross-sectional view showing a white organic light emitting device according to a second embodiment of the present disclosure.

Referring to FIG. 7, the white organic light emitting device according to a second embodiment of the present disclosure includes first and second electrodes 110 and 130 formed on a substrate 100 in such manner as to face each other. A first stack 400, a first charge generation layer 220, a second stack 500, a second charge generation layer 320 and a third stack 600 are interposed between the first and second electrodes 110 and 130. The first stack 400, the first charge generation layer 220, the second stack 500, the second charge generation layer 320 and the third stack 600 can be formed by being sequentially stacked on the first electrode 110.

The first through third stacks 400, 500 and 600 can include the same color light emission layer. Alternatively, the second stack 500 can include a different color light emission layer from those of the first and third stacks 400 and 600. In this case, different color lights emitted from the light emission layers of the first through third stacks 400, 500 and 600 are mixed, thereby realizing white light.

For example, the first and third stacks 400 and 600 can each include a light emission layer emitting blue light. Also, the second stack 500 can include either another light emission layer emitting red and yellow-green lights, or still another light emission layer emitting red and green lights. Moreover, the first and third stacks 400 and 600 can become fluorescent units, and the second stack 500 can become a phosphorescent unit.

The substrate 100 can become an insulation substrate. A thin film transistor (not shown) can be formed on the insulation substrate. The insulation substrate can be formed from one of glass, a metal material, a plastic material, polyimide (PI) and so on. The thin film transistor can include a gate electrode, a semiconductor layer, a source electrode and a drain electrode.

The first electrode 110 can be used as an anode electrode. Also, the first electrode 110 can be formed from a transparent conductive material. For example, the first electrode 110 can be formed from one selected from a material group which includes ITO (indium-tin-oxide), IZO (indium-zinc-oxide) and ZnO.

The second electrode 130 can be used as a cathode electrode. Also, the second electrode 130 can be formed from a metal material with a low work function. For example, the second electrode 130 can be formed from one selected from a group which includes Mg, Ca, Al, Al-alloys, Ag, Ag-alloys, Au and Au-alloys.

The first charge generation layer 220 interposed between the first and second stacks 400 and 500 can apply electrons to the first stack 400 and holes to the second stack 500. As such, the first charge generation layer 220 can adjust (or control) charge balance between the first and second stacks 400 and 500. Similarly, the second charge generation layer 320 interposed between the second and third stacks 500 and 600 can apply electrons to the second stack 500 and holes to the third stack 600. As such, the second charge generation layer 320 can adjust (or control) charge balance between the second and third stacks 500 and 600.

Also, the first and second charge generation layers 220 and 320 can be formed in a single layer. For example, each of the first and second charge generation layers 220 and 320 can become either a thin metal layer, which is formed from aluminum Al or others, or a transparent electrode formed from ITO (indium-tin-oxide) or others. The first and second charge generation layers 220 and 320 with the single layer structure can enable the device to be simply configured and easily manufactured.

Alternatively, each of the first and second charge generation layers 220 and 320 can be formed in a multi-layered structure, such as a junction structure of an organic material layer which is formed by doping dopants. The first and second charge generation layers 220 and 320 with the multi-layered structure can easily transport the electrons and the holes. As such, luminous efficiency of the device can be enhanced and the life span of the device can be extended. For example, a surface layer of the first charge generation layer 220 contacting the first stack 400 and a surface layer of the second charge generation layer 320 contacting the second stack 500 can be doped with an N-type dopant, in order to smoothly transfer electrons. Also, the other surface layer of the first charge generation layer 220 contacting the second stack 500 and the other surface layer of the second charge generation layer 320 contacting the third stack 600 can be doped with a P-type dopant, in order to smoothly transfer holes.

The first stack 400 includes a hole injection layer (HIL) 402, a first hole transportation layer (HTL) 403, a first light emission layer 404 and a first electron transportation layer (ETL) 405 which are sequentially stacked between the first electrode 110 and the charge generation layer 420. The hole injection layer (HIL) 402 can be formed from a material with superior hole injection capacity. In order to smoothly inject holes, the hole injection layer (HIL) 402 can be doped with a P-type dopant.

The first light emission layer 404 can become a blue fluorescent light emission layer. Also, the first light emission layer 404 can become a single light emission layer with a single luminous peak. Such a first light emission layer 404 can include a single host doped with a blue fluorescent dopant. Alternatively, the first light emission layer 404 can include two hosts which are doped with a blue fluorescent dopant. As an example of the blue fluorescent dopant of the first light emission layer 404, a dopant with a wavelength band of the luminous peak (or, a luminous peak wavelength band) of about 420 nm~490 nm can be used.

The second stack 500 includes a second hole transportation layer (HTL) 502, a second light emission layer 503, a third light emission layer 504 and a second electron transportation layer (ETL) 505 which are sequentially stacked between the first and second charge generation layers 220 and 320. The second stack 500 allows the second and third light emission layers 503 and 504 to be formed without having any one of a charge generation and a buffer layer therebetween. In other words, the second and third light emission layers 503 and 504 can come in contact with each other. The stacked second and third light emission layers 503 and 504 can form a single light emission layer stack 501.

The light emission layer stack 501 can be formed by stacking a red phosphorescent light emission layer and a yellow-green phosphorescent light emission layer. Also, the light emission layer stack 501 can be formed in a double-layered structure with two luminous peaks. Alternatively, the light emission layer stack 501 can be formed by stacking a red phosphorescent light emission layer and a green phosphorescent light emission layer.

If the second light emission layer 503 is the red phosphorescent light emission layer, the third light emission layer 504 can become one of the green phosphorescent light emission layer and the yellow-green phosphorescent light emission layer. On the contrary, when the second light emission layer 503 is one of the green phosphorescent light emission layer and the yellow-green phosphorescent light emission layer, the third light emission layer 504 can become the red phosphorescent light emission layer. Preferably, the second light emission layer 503 becomes the red phosphorescent light emission layer and the third light emission layer 304 becomes the yellow-green phosphorescent light emission layer.

The green phosphorescent light emission layer or the yellow-green phosphorescent light emission layer can be formed by doping a green phosphorescent dopant or a yellow-green phosphorescent dopant which has a luminous peak wavelength band of about 500 nm~580 nm. The red phosphorescent light emission layer can be formed by doping a red phosphorescent dopant with a luminous peak wavelength band of 580 nm~680 nm. A doping ratio of the green or yellow-green phosphorescent dopant of the green or yellow-green phosphorescent light emission layer can become higher than that of the red phosphorescent dopant of the red phosphorescent light emission layer.

The green or yellow-green phosphorescent light emission layer can be formed thicker compared to the red phosphorescent light emission layer. Preferably, the green or yellow-green phosphorescent light emission layer becomes three times thicker than the red phosphorescent light emission layer.

The second light emission layer 503 can be formed directly on the second hole transportation layer 302. In other words, the second light emission layer 503 can come in contact with the second hole transportation layer 502. Also, the second light emission layer 503 can include two hosts doped with one of red, green and yellow-green phosphorescent dopants. The two hosts can include a hole type host and an electron type host.

The hole type host can be formed to have a range of about 20~80 volume % with respect to all the hosts. On the other hand, the electron type host can be formed to have a range of about 80~20 volume % with respect to all the hosts. The hole type host can be formed from the same material as the second hole transportation layer 502, in order to easily inject holes.

The third light emission layer 504 formed on the second light emission layer 503 can include two hosts doped with one of yellow-green, green and red phosphorescent dopants. The two hosts can include a hole type host and an electron type host. The hole type host can be formed to have a range of about 20~80 volume % with respect to all the hosts. On the other hand, the electron type host can be formed to have a range of about 80~20 volume % with respect to all the hosts.

Also, one host of the third light emission layer 504 can be formed by doping one of green, yellow-green and red phosphorescent dopants. Also, the doped host can be formed to have a bipolar property.

The third stack 600 includes a third hole transportation layer (HTL) 601, a fourth light emission layer 602, a third electron transportation layer (ETL) 603 and an electron injection layer (TIL) 604 which are sequentially stacked between the second charge generation layer 320 and the second electrode 130. The electron injection layer (EIL) 604 can be formed from a material with superior electron injection capacity. In order to smoothly inject electrons, the electron injection layer (HIL) 604 can be doped with an N-type dopant.

The fourth light emission layer 602 can become a blue fluorescent light emission layer. Also, the fourth light emission layer 602 can become a single light emission layer with a single luminous peak. Such a fourth light emission layer 602 can include a single host doped with a blue fluorescent dopant. Alternatively, the fourth light emission layer 602 can be configured with two hosts doped with a blue fluorescent dopant. As an example of the blue fluorescent dopant of the fourth light emission layer 602, a dopant with a luminous peak wavelength band of about 420 nm~490 nm can be used.

Figure 8:
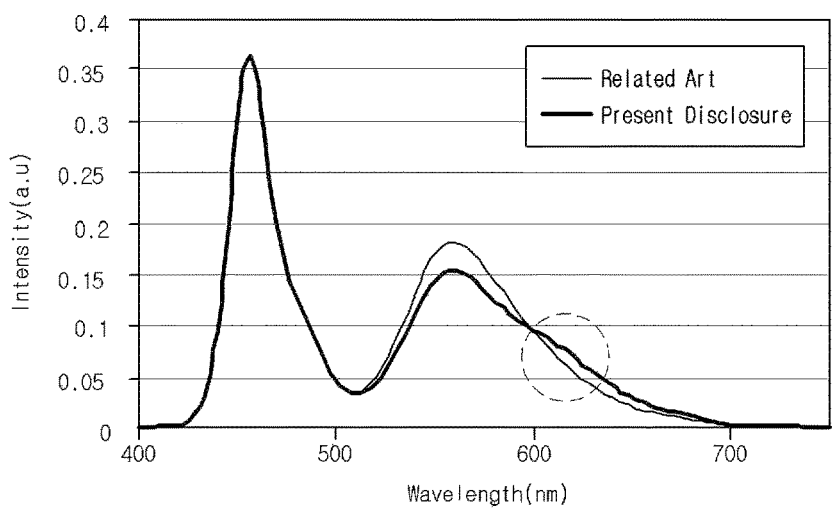
FIG. 8 is a data sheet illustrating luminous wavelength and intensity properties of white organic light emitting devices according to the present disclosure and the related art.

FIG. 8 is a data sheet illustrating luminous wavelength and intensity properties of white organic light emitting device according to the present disclosure and the related art.

FIG. 8 comparatively illustrates luminous wavelength and intensity properties of the white organic light emitting devices according to the related art and the present disclosure. The white organic light emitting device of the related art used in the experiment includes first and third stacks with blue light emission layers and a second stack with a yellow-green light emission layer. The white organic light emitting device of the present disclosure includes first and third stacks with blue light emission layers and a second stack with a red organic light emission layer and a yellow-green organic light emission layer.

Referring to a red domain represented by a dotted circle in FIG. 8, the white organic light emitting device of the related art generates only two luminous peaks, because any luminous peak is not generated in the red domain. Meanwhile, the white organic light emitting device of the present disclosure provides a three-peaked luminous property. In other words, the white organic light emitting device of the present disclosure enables the intensity in the red domain to become larger, compared to that of the related. A brightness achievement ratio, the panel efficiency and the color reproduction range will now be described in detail.

FIG. 9 is a table comparatively illustrating experimental resultants of white organic light emitting devices according to the present disclosure and the related art.

Referring to FIG. 9, if a brightness target value is set to be 100%, the white organic light emitting device of the related art can obtain a red brightness achievement ratio of 88%. In other words, the white organic light emitting device of the related art is short of red brightness. This results from the fact that a separated red light emission layer does not exist and any luminous peak is not generated in the red domain.

Meanwhile, the white organic light emitting device of the present disclosure allows the second stack to include the light emission layer stack which is formed by stacking a red organic light emission layer and a yellow-green organic light emission layer. As such, the white organic light emitting device of the present disclosure can obtain a stronger luminous intensity, compared to that of the related art.

In comparison with brightness achievement ratios in accordance with the related art and the present disclosure, the white organic light emitting device of the present disclosure can obtain the red brightness achievement ratio of 101% which is higher by 13%. In other words, the white organic light emitting device of the present disclosure can provide a larger red brightness achievement ratio than the brightness target value of 100%. Also, it is evident that green and blue brightness achievement ratios of the white organic light emitting device according to the present disclosure are in excess of the brightness target value of 100%.

Moreover, it is evident that the panel efficiency of the white organic light emitting device of the present disclosure is equal to or larger than that of the related art. Furthermore, the color reproduction range increases as the luminous intensity in the red wavelength domain becomes stronger.

In this manner, the white organic light emitting device according to the present disclosure configured with first and second stacks or first through third stacks can provide a three-peaked luminous property. Also, because the light emission layer of the second stack adjacent to the hole transportation layer is formed from the same material as the hole transportation layer, it can be easy to inject holes. Moreover, the thickness and the doping density of the light emission layer within the second stack are optimized. In accordance therewith, the panel efficiency and the color reproduction range can be enhanced, and power consumption can be reduced. Furthermore, the white organic light emitting device with the first through third stacks enables the organic light emission layer of the second stack to be formed in a double-layered structure. As such, the red brightness achievement ratio and the color reproduction range can increase.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents without being limited to the detailed description.

What is claimed is:

1. An organic light emitting device comprising:
   first and second electrodes formed to face each other on a substrate;
   a first stack interposed between the first and second electrode and configured with a hole injection layer, a first hole transportation layer, a first light emission layer and a first electron transportation layer which are stacked on the first electrode;
   a second stack interposed between the first stack and the second electrode and configured with a second hole transportation layer, a second light emission layer, a third light emission layer and a second electron transportation layer which are stacked on the first stack;
   a third stack interposed between the second stack and the second electrode and configured with a third hole transportation layer, a fourth light emission layer, a third electron transportation layer and an electron injection layer which are stacked on the second stack; and
   a first charge generation layer interposed between the first and second stacks and a second charge generation layer interposed between the second and third stacks,
   wherein each of the first and fourth light emission layers is a blue fluorescent light emission layer including at least one host and a blue fluorescent dopant with a luminous peak wavelength band of 420 nm~490 nm, and
   wherein the second and third light emission layers of the second stack are both disposed between the first and second charge generation layers and both the second and third light emission layers of the second stack come in contact with each other, one of the second and third light emission layers is one of green and yellow-green phosphorescent light emission layer including at least one host and a green phosphorescent dopant or a yellow-green phosphorescent dopant with a luminous peak wavelength band of 500 nm~580 nm, and the other one of the second and third light emission layers is a red phosphorescent light emission layer including at least one host and a red phosphorescent dopant with a luminous peak wavelength band of 580 nm~680 nm.

2. The organic light emitting device of claim 1, wherein the second light emission layer comes in direct contact with the second hole transportation layer and includes hole and electron type hosts doped with a dopant.

3. The organic light emitting device of claim 2, wherein the hole type host of the second light emission layer is formed from the same material as the second hole transportation layer.

4. The organic light emitting device of claim 2, wherein the hole type host of the second light emission layer is formed in a range of 20~80 volume % with respect to all the hosts.

5. The organic light emitting device of claim 1, wherein the third light emission layer includes hole and electron type hosts doped with a dopant.

6. The organic light emitting device of claim 5, wherein the hole type host of the third light emission layer is formed in a range of 20~80 volume % with respect to all the hosts.

7. The organic light emitting device of claim 1, wherein the third light emission layer includes a bipolarity host doped with a dopant.

8. The organic light emitting device of claim 1, wherein the green phosphorescent light emission layer or the yellow-green phosphorescent light emission layer is thicker than the red phosphorescent light emission layer.

9. The organic light emitting device of claim 8, wherein the green phosphorescent light emission layer or the yellow-green phosphorescent light emission layer is thrice as thick as the red phosphorescent light emission layer.

10. The organic light emitting device of claim 1, wherein the green phosphorescent light emission layer or the yellow-green phosphorescent light emission layer is higher than the red phosphorescent light emission layer in a doping ratio of the dopant.

11. The organic light emitting device of claim 1, wherein the first charge generation layer and the second charge generation layer adjust a charge balance between the first, second and third stacks.

12. The organic light emitting device of claim 1, wherein the blue fluorescent light emission layer has at least one luminous peak, and both the second and third light emission layers of the second stack have at least two luminous peaks.

13. The organic light emitting device of claim 1, wherein one of the first and second electrodes is a cathode, and one of the first and third stacks comprises a blue fluorescent light emission layer in contact with the cathode.

14. The organic light emitting device of claim 1, wherein the organic light emitting device is a white organic light emitting device.

15. An organic light emitting device comprising:
   first and second electrodes formed to face each other on a substrate;
   a first stack interposed between the first and second electrodes and configured with a hole injection layer, a first hole transportation layer, a first blue fluorescent light emission layer and a first electron transportation layer which are stacked on the first electrode;
   a second stack interposed between the first stack and the second electrode and configured with a second hole transportation layer, a plurality of light emission layers and a second electron transportation layer which are stacked on the first stack, one of the plurality of light emission layers being a red phosphorescent light emission layer;
   a third stack interposed between the second stack and the second electrode and configured with a third hole transportation layer, a second blue fluorescent light emission layer, a third electron transportation layer and an electron injection layer which are stacked on the second stack; and
   a first charge generation layer interposed between the first and second stacks and a second charge generation layer interposed between the second and third stacks,
   wherein each of the first and second blue fluorescent light emission layers includes at least one host and a blue fluorescent dopant with a luminous peak wavelength band of 420 nm~490 nm, and
   wherein the red phosphorescent light emission layer includes at least one host and a red phosphorescent dopant with a luminous peak wavelength band of 580 nm~680 nm.

16. The organic light emitting device of claim 15, wherein another of the plurality of light emission layers is:
- a yellow-green phosphorescent light emission layer including at least one host and a green phosphorescent dopant or a yellow-green phosphorescent dopant with a luminous peak wavelength band of 500 nm~580 nm, or
- a green phosphorescent light emission layer including at least one host and a green phosphorescent dopant or a green phosphorescent dopant with a luminous peak wavelength band of 500 nm~580 nm.

17. The organic light emitting device of claim 16, wherein the red phosphorescent light emission layer and the yellow-green or green phosphorescent light emission layer are in contact with each other.

18. The organic light emitting device of claim 16, wherein the yellow-green or green phosphorescent light emission layer is thicker than the red phosphorescent light emission layer.

19. The organic light emitting device of claim 18, wherein the yellow-green or green phosphorescent light emission layer is thrice as thick as the red phosphorescent light emission layer.

20. The organic light emitting device of claim 16, wherein the yellow-green or green phosphorescent light emission layer is higher than the red phosphorescent light emission layer in a doping ratio of the dopant.

21. The organic light emitting device of claim 15, wherein each of the first stack and the third stack has at least one luminous peak, and the second stack has at least two luminous peaks.

22. The organic light emitting device of claim 15, wherein the first charge generation layer and the second charge generation layer adjust a charge balance between the first, second and third stacks.

* * * * *